(12) United States Patent
Yang et al.

(10) Patent No.: US 9,837,286 B2
(45) Date of Patent: Dec. 5, 2017

(54) SYSTEMS AND METHODS FOR SELECTIVELY ETCHING TUNGSTEN IN A DOWNSTREAM REACTOR

(71) Applicant: Lam Research Corporation, Fremont, CA (US)

(72) Inventors: Dengliang Yang, Union City, CA (US); Helen H. Zhu, Fremont, CA (US); George Matamis, Danville, CA (US); Brad Jacobs, East Helena, MO (US); Joon Hong Park, Dublin, CA (US); Joydeep Guha, Danville, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 15/014,539

(22) Filed: Feb. 3, 2016

(65) Prior Publication Data
US 2017/0069511 A1  Mar. 9, 2017

Related U.S. Application Data
(60) Provisional application No. 62/214,549, filed on Sep. 4, 2015.

(51) Int. Cl.
*H01L 21/3213* (2006.01)
*H01L 21/311* (2006.01)
(Continued)

(52) U.S. Cl.
CPC ...... *H01L 21/32136* (2013.01); *H01J 37/321* (2013.01); *H01J 37/32357* (2013.01);
(Continued)

(58) Field of Classification Search
None
See application file for complete search history.

(56) References Cited

U.S. PATENT DOCUMENTS

| 4,374,698 A | 2/1983 | Sanders et al. |
| 4,431,477 A | 2/1984 | Zajac |

(Continued)

FOREIGN PATENT DOCUMENTS

| EP | 0424299 A2 | 4/1991 |
| EP | 0424299 A3 | 8/1991 |

(Continued)

OTHER PUBLICATIONS

U.S. Appl. No. 14/945,680, filed Nov. 19, 2015, Drewery et al.
(Continued)

*Primary Examiner* — Jiong-Ping Lu

(57) ABSTRACT

A method for selectively etching a tungsten layer on a substrate includes arranging a substrate including a tungsten layer on a substrate support. The substrate processing chamber includes an upper chamber region, an inductive coil arranged outside of the upper chamber region, a lower chamber region including the substrate support and a gas dispersion device arranged between the upper and lower chamber regions. The gas dispersion device includes a plurality of holes in fluid communication with the upper and lower chamber regions. The method further includes controlling pressure in the substrate processing chamber in a range from 0.4 Torr to 10 Torr; supplying an etch gas mixture including fluorine-based gas to the upper chamber region; striking inductively coupled plasma in the upper chamber region by supplying power to the inductive coil; and selectively etching the tungsten layer relative to at least one other film material of the substrate.

20 Claims, 10 Drawing Sheets

(51) Int. Cl.
*H01L 21/67* (2006.01)
*H01L 21/02* (2006.01)
*H01L 21/3065* (2006.01)
*H01J 37/32* (2006.01)

(52) U.S. Cl.
CPC .... *H01J 37/32422* (2013.01); *H01L 21/0234* (2013.01); *H01L 21/02071* (2013.01); *H01L 21/3065* (2013.01); *H01L 21/31116* (2013.01); *H01L 21/31138* (2013.01); *H01L 21/32139* (2013.01); *H01L 21/67069* (2013.01); *H01J 2237/334* (2013.01)

(56) References Cited

U.S. PATENT DOCUMENTS

| | | | |
|---|---|---|---|
| 6,042,687 | A | 3/2000 | Singh et al. |
| 6,060,400 | A | 5/2000 | Oehrlein et al. |
| 6,074,959 | A | 6/2000 | Wang et al. |
| 6,376,386 | B1 | 4/2002 | Oshima |
| 6,841,943 | B2 | 1/2005 | Vahedi et al. |
| 6,962,879 | B2 | 11/2005 | Zhu et al. |
| 7,129,171 | B2 | 10/2006 | Zhu et al. |
| 7,288,482 | B2 | 10/2007 | Panda et al. |
| 7,309,646 | B1 | 12/2007 | Heo et al. |
| 7,338,907 | B2 | 3/2008 | Li et al. |
| 7,758,698 | B2 | 7/2010 | Bang et al. |
| 8,137,463 | B2 | 3/2012 | Liu et al. |
| 8,552,334 | B2 | 10/2013 | Tappan et al. |
| 8,592,328 | B2 | 11/2013 | Hausmann et al. |
| 8,889,024 | B2 | 11/2014 | Watanabe et al. |
| 8,956,980 | B1 | 2/2015 | Chen et al. |
| 9,051,647 | B2 | 6/2015 | Cooperberg et al. |
| 9,059,678 | B2 | 6/2015 | Long et al. |
| 9,318,343 | B2 | 4/2016 | Ranjan et al. |
| 9,640,409 | B1 | 5/2017 | Yang et al. |
| 2002/0160125 | A1 | 10/2002 | Johnson et al. |
| 2002/0175144 | A1 | 11/2002 | Hung et al. |
| 2005/0155625 | A1 | 7/2005 | Jangjian et al. |
| 2007/0026684 | A1 | 2/2007 | Parascandola et al. |
| 2009/0221117 | A1 | 9/2009 | Tan et al. |
| 2010/0178770 | A1 | 7/2010 | Zin |
| 2012/0034786 | A1 | 2/2012 | Dhindsa et al. |
| 2012/0149213 | A1 | 6/2012 | Nittala et al. |
| 2012/0238102 | A1 | 9/2012 | Zhang et al. |
| 2012/0238103 | A1* | 9/2012 | Zhang ............... H01J 37/32422 438/720 |
| 2012/0244715 | A1* | 9/2012 | Lebouitz ........... H01L 21/32135 438/706 |
| 2013/0029494 | A1 | 1/2013 | Sasaki et al. |
| 2014/0080308 | A1 | 3/2014 | Chen et al. |
| 2014/0120737 | A1 | 5/2014 | Swaminathan et al. |
| 2014/0141621 | A1 | 5/2014 | Ren et al. |
| 2014/0248780 | A1 | 9/2014 | Ingle et al. |
| 2014/0262038 | A1 | 9/2014 | Wang et al. |
| 2015/0017810 | A1 | 1/2015 | Guha |
| 2016/0181116 | A1 | 6/2016 | Berry, III et al. |
| 2016/0247688 | A1 | 8/2016 | Zhu et al. |
| 2017/0032982 | A1 | 2/2017 | Drewery et al. |
| 2017/0110335 | A1 | 4/2017 | Yang et al. |

FOREIGN PATENT DOCUMENTS

| | | |
|---|---|---|
| EP | 0838842 A2 | 4/1998 |
| WO | WO-0040776 A1 | 7/2000 |
| WO | WO-2011051251 A1 | 5/2011 |

OTHER PUBLICATIONS

U.S. Appl. No. 15/013,400, filed Feb. 2, 2016, Yang et al.
U.S. Appl. No. 62/275,837, filed Jan. 7, 2016, Treadwell et al.
U.S. Appl. No. 15/399,692, Treadwell et al.
Blain (Mar./ Apr. 1999) "Mechanism of nitrogen removal from silicon nitride by nitric oxide," Journal of Vacuum Science & Technology A, 17(2):665-667.
Blain et al. (Jul./Aug. 1996) "Role of nitrogen in the downstream etching of silicon nitride," Journal of Vacuum Science & Technology A, 14(4):2151-2157.
Bohr, Mark, "The New Era of Scaling in an SoC World" Intel Logic Technology Development; ISSCC; 2009; 66 Pages.
Dusa, Mircean et al., "Pitch Doubling Through Dual Patterning Lithography Challenges in Integration and Litho Budgets," Optical Microlithography XX, vol. 6520, 65200G, (2007); 10 pages.
European Extended Search Report dated May 30, 2016 issued in EP 15 199 363.1 [LAMRP146EP].
Kastenmeier et al. (Nov./Dec. 1999) "Highly selective etching of silicon nitride over silicon and silicon dioxide," J. Vac. Sci. Technol. A, American Vacuum Society, I7 (6):3179-3184.
Kastenmeier et al. (Sep./Oct. 1996) "Chemical dry etching of silicon nitride and silicon dioxide using $CF_4/O_2/N_2$ gas mixtures," J. Vac. Sci. Technol. A14(5):2802-2813.
Oehrlein et al. (1996) "Study of plasma-surface interactions: chemical dry etching and high-density plasma etching," Plasma Sources Sci. Technol. 5:193-199.
Tajima et al. (2013) "Room-Temperature Si Etching in $NO/F_2$ Gases and the Investigation of Surface Reaction Mechanisms," The Journal of Physical Chemistry C, 117:5118-5125.
U.S. Office Action dated Oct. 5, 2015 issued in U.S. Appl. No. 14/576,020 [LAMRP146].
U.S. Final Ofice Action dated Feb. 26, 2016 issued in U.S. Appl. No. 14/576,020 [LAMRP146].
U.S. Office Action dated Sep. 23, 2016 issued in U.S. Appl. 14/576,020 [LAMRP146].
Yun et al. (2007) "Large Etch Rate Enhancement by NO-Induced Surface Chemical Reaction during Chemical Dry Etching of Silicon Oxide in $F_2$ Remote Plasmas," Journal of the Electrochemical Society, 154(4):D267-D272.

* cited by examiner

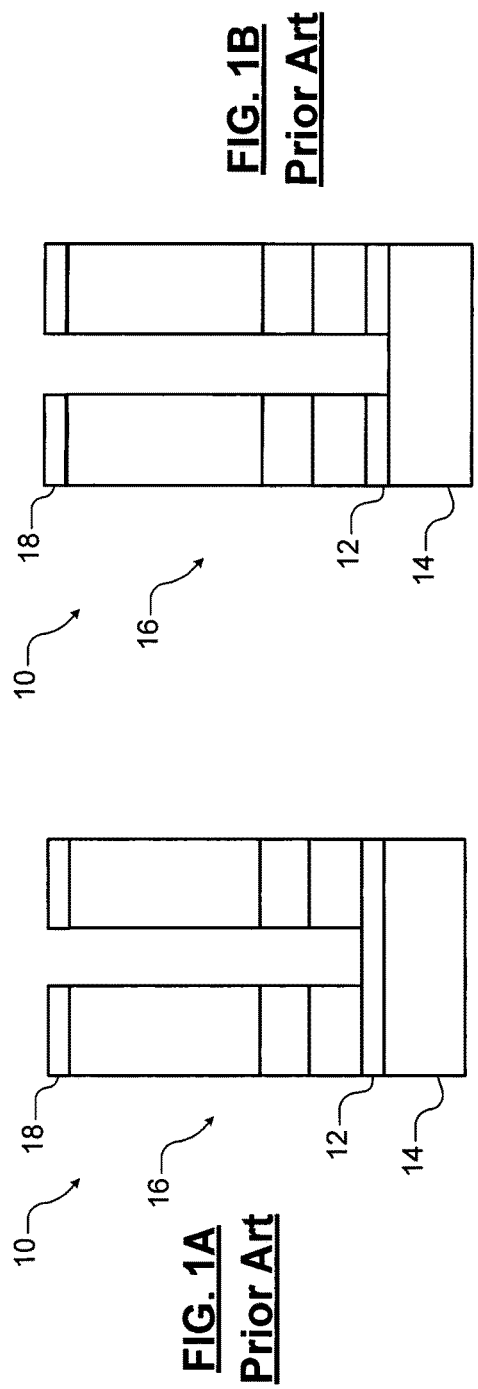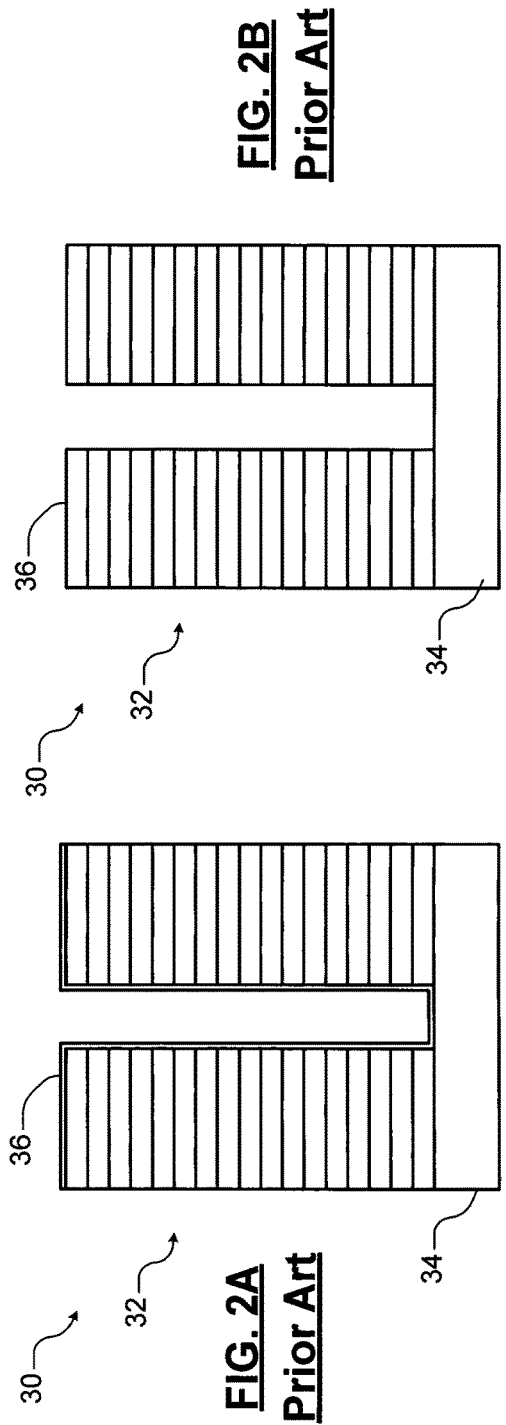

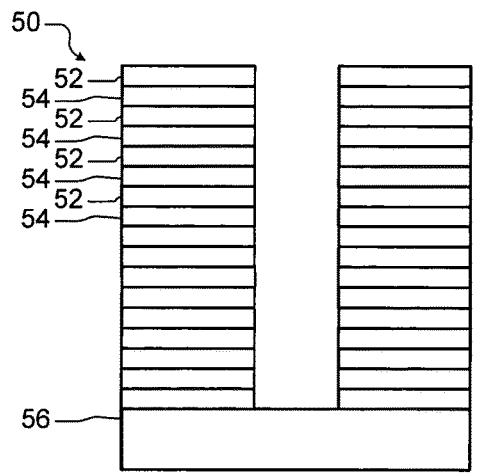 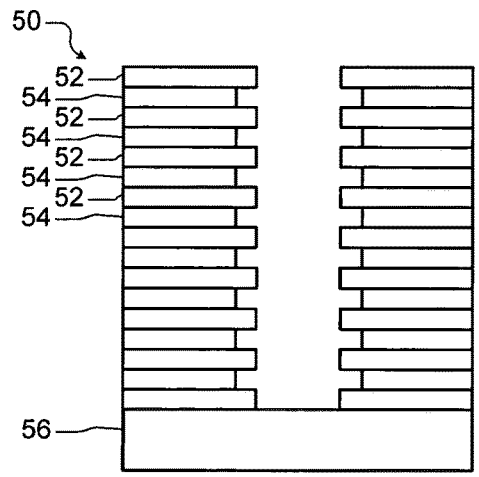
FIG. 3A
Prior Art
FIG. 3B
Prior Art
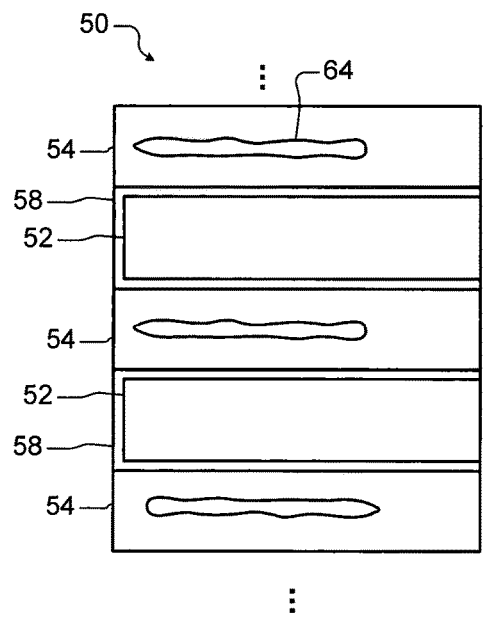 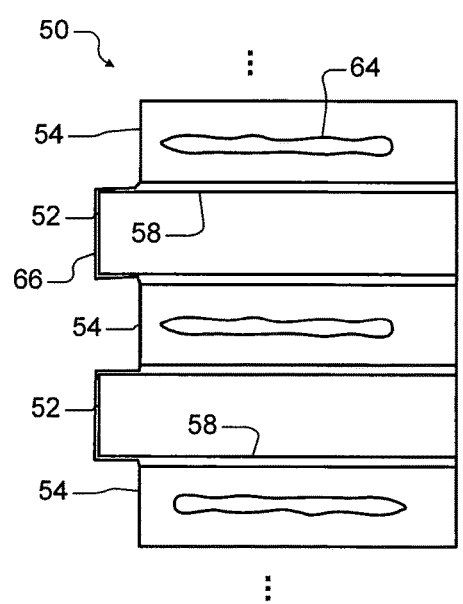
FIG. 3C
Prior Art
FIG. 3D
Prior Art

SYSTEMS AND METHODS FOR SELECTIVELY ETCHING TUNGSTEN IN A DOWNSTREAM REACTOR

CROSS-REFERENCE TO RELATED APPLICATIONS

This application claims the benefit of U.S. Provisional Application No. 62/214,549, filed on Sep. 4, 2015. The entire disclosure of the application referenced above is incorporated herein by reference.

FIELD

The present disclosure relates to substrate processing, and more particularly to substrate processing systems and methods for selectivity etching tungsten relative to one or more other film materials.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to etch film on a substrate such as a semiconductor wafer. The substrate processing systems typically include a processing chamber, a gas distribution device and a substrate support. During processing, the substrate is arranged on the substrate support. Different gas mixtures may be introduced into the processing chamber and radio frequency (RF) plasma may be used to activate chemical reactions.

In some processes, tungsten (W) film needs to be etched with very high selectivity to a hard mask layer, interlayer dielectric (ILD) such as silicon dioxide ($SiO_2$) or other film materials. For example only, a thin W film may need to be etched in cross point memory structures during processing. In other examples, W film is recessed after a chemical vapor deposition (CVD) W fill step in memory structures including alternating oxide nitride (ON) or oxide polysilicon (OP) layers (e.g. ONON/OPOP memory structures).

In still other processes, both W film and film in a barrier layer need to be selectively etched relative to other film materials. In some examples, the W film may have voids. Therefore, etching of the W film and the film in the barrier layer need to be performed selectively relative to other film materials and without etching through voids of the W film.

Referring now to FIGS. 1A to 3D, various examples of etching of W film are shown. In FIGS. 1A-1B, a substrate 10 includes a W layer 12 arranged on one or more underlying layers 14. One or more layers 16 may be arranged on the W layer 12. A hardmask layer 18 may be arranged on the one or more layers 16 or the W layer 12. FIG. 1A shows the substrate 10 before etching while FIG. 1B shows the substrate 10 after etching.

In FIGS. 2A-2B, a substrate 30 includes multiple layers 32 that may be arranged on one or more underlying layers 34. A W layer 36 is arranged on the multiple layers 32. FIG. 2A shows the substrate 30 before etching while FIG. 2B shows the substrate 30 after etching.

In FIGS. 3A-3D, a NAND device includes a stack of layers 50 including fins 52 that are typically made of oxide film and intervening W film layers 54. During processing, the W film layers 54 need to be etched inwardly relative to ends of the fins 52 as can be seen in FIG. 3B. In FIG. 3C, barrier layers 58 are typically formed on the fins 52 during processing. The W film layers 54 may have voids 64 as can be seen in FIG. 3C. Etching in the voids 64 should be avoided. The barrier layers 58 may be made of titanium (Ti) or titanium nitride (TiN). During etching, the W film 54 needs to be etched back relative to the fins 52 (as can be seen at 66). The barrier layers 58 adjacent to ends of the fins 52 also need to be etched. If the barrier layer 58 is only partially etched at ends of the fins 52, the barrier layers 58 may short two or more adjacent W film layers.

Etching W film is typically performed using fluorine and/or chlorine plasma gas chemistry at low pressure between 1 mTorr and 300 mTorr. In these processes, plasma damage tends to occur due to ions and radical flux generated during etching. As a result of the ion bombardment, mask selectivity is generally poor. The lateral recess is also difficult due to low radical density in these low pressure regime.

SUMMARY

A method for selectively etching a tungsten layer on a substrate includes arranging a substrate including a tungsten layer on a substrate support of a substrate processing chamber. The substrate processing chamber includes an upper chamber region, an inductive coil arranged outside of the upper chamber region, a lower chamber region including the substrate support and a gas dispersion device arranged between the upper chamber region and the lower chamber region. The gas dispersion device includes a plurality of holes in fluid communication with the upper chamber region and the lower chamber region. The method further includes controlling pressure in the substrate processing chamber in a range from 0.4 Torr to 10 Torr; supplying an etch gas mixture including fluorine-based gas to the upper chamber region; striking inductively coupled plasma in the upper chamber region by supplying power to the inductive coil; and selectively etching the tungsten layer relative to at least one other film material of the substrate for a predetermined period.

In other features, the at least one other film material includes silicon nitride, silicon dioxide, metal oxide or carbon. The etch gas mixture includes molecular hydrogen and a gas selected from a group consisting of carbon tetrafluoride, nitrogen trifluoride, and sulfur hexafluoride. The selective etching of the tungsten layer is greater than 100:1.

In other features, the etch gas mixture includes a first gas selected from a group consisting of molecular chlorine, molecular oxygen and molecular nitrogen and a second gas selected from a group consisting of carbon tetrafluoride, nitrogen trifluoride, sulfur hexafluoride, fluoromethane and difluoromethane. The selective etching of the tungsten layer is greater than 100:1, the substrate includes a barrier layer, and etching of the tungsten layer relative to the barrier layer is between 0.9:1 and 1.1:1, although other etch ratios can be used.

In other features, the first gas includes both molecular oxygen and molecular nitrogen. The method further includes supplying the first gas including one of molecular oxygen and molecular nitrogen with the second gas during a first predetermined etch period; and after the first predetermined etch period, supplying the first gas including the other one of molecular oxygen and molecular nitrogen with the second gas during a second predetermined etch period.

In other features, the first predetermined period and the second predetermined period are in a range from five seconds to 60 seconds. A radio frequency (RF) bias is supplied to the substrate support. A radio frequency (RF) bias is not supplied to the substrate support. The etch gas mixture includes one or more additive gas(es) selected from a group consisting of argon, helium, and molecular nitrogen. The gas dispersion device includes a showerhead plate including a plurality of holes.

In other features, the plurality of holes have diameters in a range from 0.4" to 0.75". A gas injector is arranged adjacent to an upper surface of the upper chamber region to inject the etch gas mixture, the gas dispersion device is arranged adjacent to a lower surface of the upper chamber region, and the gas dispersion device is connected to a reference potential. The at least one other film material includes a hard mask layer. The tungsten layer is selectively etched relative to the hard mask layer. The hard mask layer is made of a material selected from a group consisting of silicon nitride, silicon dioxide and carbon. The etch gas mixture further comprises molecular chlorine.

A method for selectively etching a tungsten layer on a substrate includes arranging a substrate including a tungsten layer on a substrate support of a substrate processing chamber. The substrate processing chamber includes an upper chamber region, an inductive coil arranged outside of the upper chamber region, a lower chamber region including the substrate support and a gas dispersion device arranged between the upper chamber region and the lower chamber region. The gas dispersion device includes a plurality of holes in fluid communication with the upper chamber region and the lower chamber region. The method includes controlling pressure in the substrate processing chamber in a range from 0.4 Torr to 10 Torr. The method further includes supplying an etch gas mixture to the upper chamber region. The etch gas mixture includes carbon monoxide; striking inductively coupled plasma in the upper chamber region by supplying power to the inductive coil. The method further includes selectively etching the tungsten layer relative to at least one other film material of the substrate for a predetermined period.

In other features, the film material includes at least one of silicon nitride, silicon dioxide, metal oxide and carbon. The selective etching of the tungsten layer is greater than 100:1. The etch gas mixture further includes molecular nitrogen. A radio frequency (RF) bias is supplied to the substrate support. A radio frequency (RF) bias is not supplied to the substrate support. The etch gas mixture further includes one or more additive gas(es) selected from a group consisting of argon and helium. The gas dispersion device includes a showerhead plate including a plurality of holes. The plurality of holes have diameters in a range from 0.4" to 0.75".

In other features, a gas injector injects the etch gas mixture and is arranged adjacent to an upper surface of the upper chamber region, the gas dispersion device is arranged adjacent to a lower surface of the upper chamber region, and the gas dispersion device is grounded. The substrate includes a hard mask layer. The tungsten layer is selectively etched relative to the hard mask layer. The hard mask layer is made of a material selected from a group consisting of silicon nitride, silicon dioxide and carbon.

A method for selectively etching a tungsten layer on a substrate includes arranging a substrate including a tungsten layer on a substrate support of a substrate processing chamber. The substrate processing chamber includes an upper chamber region, an inductive coil arranged outside of the upper chamber region, a lower chamber region including the substrate support and a gas dispersion device arranged between the upper chamber region and the lower chamber region. The gas dispersion device includes a plurality of holes in fluid communication with the upper chamber region and the lower chamber region. The method further includes controlling pressure in the substrate processing chamber in a range from 0.4 Torr to 10 Torr; and supplying an etch gas mixture to the upper chamber region. The etch gas mixture includes molecular chlorine. The method further includes striking inductively coupled plasma in the upper chamber region by supplying power to the inductive coil; and selectively etching the tungsten layer of the substrate relative to at least one other film material of the substrate for a predetermined period.

In other features, the film material includes at least one of silicon nitride, silicon dioxide, metal oxide and carbon. The selective etching of the tungsten layer is greater than 100:1. The etch gas mixture further includes molecular oxygen. A radio frequency (RF) bias is supplied to the substrate support. A radio frequency (RF) bias is not supplied to the substrate support. The etch gas mixture further includes one or more additive gas(es) selected from a group consisting of argon and helium. The gas dispersion device includes a showerhead plate including a plurality of holes. The plurality of holes have diameters in a range from 0.4" to 0.75".

In other features, a gas injector is arranged adjacent to an upper surface of the upper chamber region to inject the etch gas mixture, the gas dispersion device is arranged adjacent to a lower surface of the upper chamber region, and the gas dispersion device is connected to a reference potential.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 1A and 1B are cross-sectional side views of an example of a substrate including a tungsten (W) film layer before and after etching according to the prior art;

FIGS. 2A and 2B are cross-sectional side views of another example of a substrate including a W film layer before and after etching according to the prior art;

FIGS. 3A-3D are cross-sectional side views of another example of a substrate including a W film layer before and after etching according to the prior art;

In the drawings, reference numbers may be reused to identify similar and/or identical elements.

DETAILED DESCRIPTION

In some examples, the systems and methods according to the present disclosure enable selective etching of tungsten (W) film relative to various other film materials or selective etching of both W film and a barrier layer relative to other film materials. In some examples, the barrier layer is made of titanium (Ti) or titanium nitride (TiN). In some examples, the etching is performed in a substrate processing chamber (described below) at relatively high pressure. In some examples, the present disclosure allows selective etching of tungsten, titanium or titanium nitride relative to other film materials such as silicon nitride, silicon dioxide, metal oxide, carbon and other film materials.

Figure 4:
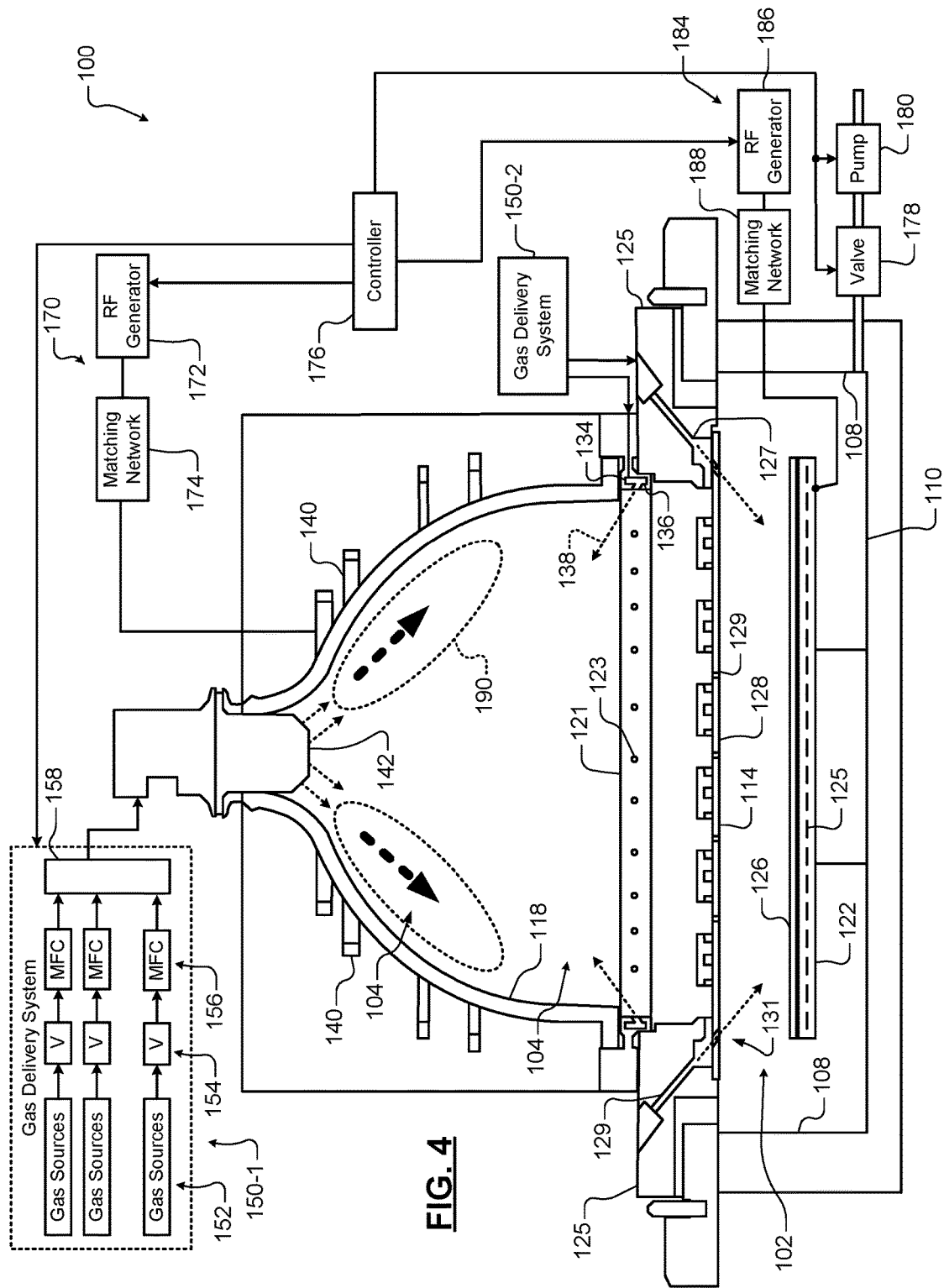
FIG. 4 is a functional block diagram of an example of a processing chamber according to the present disclosure.

Referring now to FIG. 4, an example of a substrate processing chamber 100 for etching a W layer of a substrate according to the present disclosure is shown. While a specific substrate processing chamber is shown and described, the methods described herein may be implemented on other types of substrate processing systems.

The substrate processing chamber 100 includes a lower chamber region 102 and an upper chamber region 104. The lower chamber region 102 is defined by chamber sidewall surfaces 108, a chamber bottom surface 110 and a lower surface of a gas distribution device 114.

The upper chamber region 104 is defined by an upper surface of the gas distribution device 114 and an inner surface of a dome 118. In some examples, the dome 118 rests on a first annular support 121. In some examples, the first annular support 121 includes one or more spaced holes 123 for delivering process gas to the upper chamber region 104, as will be described further below. In some examples, the process gas is delivered by the one or more spaced holes 123 in an upward direction at an acute angle relative to a plane including the gas distribution device 114, although other angles/directions may be used. In some examples, a gas flow channel 134 in the first annular support 121 supplies gas to the one or more spaced holes 123.

The first annular support 121 may rest on a second annular support 125 that defines one or more spaced holes 127 for delivering process gas from a gas flow channel 129 to the lower chamber region 102. In some examples, holes 131 in the gas distribution device 114 align with the holes 127. In other examples, the gas distribution device 114 has a smaller diameter and the holes 131 are not needed. In some examples, the process gas is delivered by the one or more spaced holes 127 in a downward direction towards the substrate at an acute angle relative to the plane including the gas distribution device 114, although other angles/directions may be used.

In other examples, the upper chamber region 104 is cylindrical with a flat top surface and one or more flat inductive coils may be used. In still other examples, a single chamber may be used with a spacer located between a showerhead and the substrate support.

A substrate support 122 is arranged in the lower chamber region 104. In some examples, the substrate support 122 includes an electrostatic chuck (ESC), although other types of substrate supports can be used. A substrate 126 is arranged on an upper surface of the substrate support 122 during etching. In some examples, a temperature of the substrate 126 may be controlled by a heater plate 125, an optional cooling plate with fluid channels and one or more sensors (not shown); although any other suitable substrate support temperature control system may be used.

In some examples, the gas distribution device 114 includes a showerhead (for example, a plate 128 having a plurality of spaced holes 129). The plurality of spaced holes 129 extend from the upper surface of the plate 128 to the lower surface of the plate 128. In some examples, the spaced holes 129 have a diameter in a range from 0.4" to 0.75" and the showerhead is made of a conducting material such as aluminum or a non-conductive material such as ceramic with an embedded electrode made of a conducting material.

One or more inductive coils 140 are arranged around an outer portion of the dome 118. When energized, the one or more inductive coils 140 create an electromagnetic field inside of the dome 118. In some examples, an upper coil and a lower coil are used. A gas injector 142 injects one or more gas mixtures from a gas delivery system 150-1.

In some examples, a gas delivery system 150-1 includes one or more gas sources 152, one or more valves 154, one or more mass flow controllers (MFCs) 156, and a mixing manifold 158, although other types of gas delivery systems may be used. A gas splitter (not shown) may be used to vary flow rates of a gas mixture. Another gas delivery system 150-2 may be used to supply an etch gas or an etch gas mixture to the gas flow channels 129 and/or 134 (in addition to or instead of etch gas from the gas injector 142).

Suitable gas delivery systems are shown and described in commonly assigned U.S. patent application Ser. No. 14/945,680, entitled "Gas Delivery System" and filed on Dec. 4, 2015, which is hereby incorporated by reference in its entirety. Suitable single or dual gas injectors and other gas injection locations are shown and described in commonly assigned U.S. Provisional Patent Application Ser. No. 62/275,837, entitled "Substrate Processing System with Multiple Injection Points and Dual Injector" and filed on Jan. 7, 2016, which is hereby incorporated by reference in its entirety.

In some examples, the gas injector 142 includes a center injection location that directs gas in a downward direction and one or more side injection locations that inject gas at an angle with respect to the downward direction. In some examples, the gas delivery system 150-1 delivers a first portion of the gas mixture at a first flow rate to the center injection location and a second portion of the gas mixture at a second flow rate to the side injection location(s) of the gas injector 142. In other examples, different gas mixtures are delivered by the gas injector 142. In some examples, the gas delivery system 150-1 delivers tuning gas to the gas flow channels 129 and 134 and/or to other locations in the processing chamber as will be described below.

A plasma generator 170 may be used to generate RF power that is output to the one or more inductive coils 140. Plasma 190 is generated in the upper chamber region 104. In some examples, the plasma generator 170 includes an RF generator 172 and a matching network 174. The matching network 174 matches an impedance of the RF generator 172 to the impedance of the one or more inductive coils 140. In some examples, the gas distribution device 114 is connected to a reference potential such as ground. A valve 178 and a pump 180 may be used to control pressure inside of the lower and upper chamber regions 102, 104 and to evacuate reactants.

A controller 176 communicates with the gas delivery systems 150-1 and 150-2, the valve 178, the pump 180, and/or the plasma generator 170 to control flow of process gas, purge gas, RF plasma and chamber pressure. In some examples, plasma is sustained inside the dome 118 by the one or more inductive coils 140. One or more gas mixtures are introduced from a top portion of the chamber using the gas injector 142 (and/or holes 123) and plasma is confined within the dome 118 using the gas distribution device 114.

Confining the plasma in the dome 118 allows volume recombination of plasma species and effusing desired etchant species through the gas distribution device 114. In some examples, there is no RF bias applied to the substrate 126. As a result, there is no active sheath on the substrate 126 and ions are not hitting the substrate with any finite energy. Some amount of ions will diffuse out of the plasma region through the gas distribution device 114. However, the amount of plasma that diffuses is an order of magnitude lower than the plasma located inside the dome 118. Most of ions in the plasma are lost by volume recombination at high pressures. Surface recombination loss at the upper surface of the gas distribution device 114 also lowers ion density below the gas distribution device 114.

In other examples, an RF bias generator 184 is provided and includes an RF generator 186 and a matching network 188. The RF bias can be used to create plasma between the gas distribution device 114 and the substrate support or to create a self-bias on the substrate 126 to attract ions. The controller 176 may be used to control the RF bias.

Selective Etching of W Film Using $NF_3$, $CF_4$ or $SF_6$ and $H_2$

In some examples, the systems and methods according to the present disclosure selectively etch W film layers of a substrate with high selectively to hard mask layers. For example only, the hard mask layer may be made of silicon nitride (SiN), silicon dioxide ($SiO_2$), carbon or other film materials. In some examples, the systems and methods according to the present disclosure use the downstream plasma reactor in FIG. 4 to etch the W layer. In some examples, the downstream plasma reactor operates at relatively high pressures between 0.4 Torr and 10 Torr. In some examples, the downstream plasma reactor operates at relatively high pressures between 0.5 Torr and 6 Torr, although other pressures may be used.

In some examples, an etch gas mixture includes molecular hydrogen ($H_2$) and a gas selected from a group consisting of nitrogen trifluoride ($NF_3$), carbon tetrafluoride ($CF_4$) or sulfur hexafluoride ($SF_6$).

Figure 5:
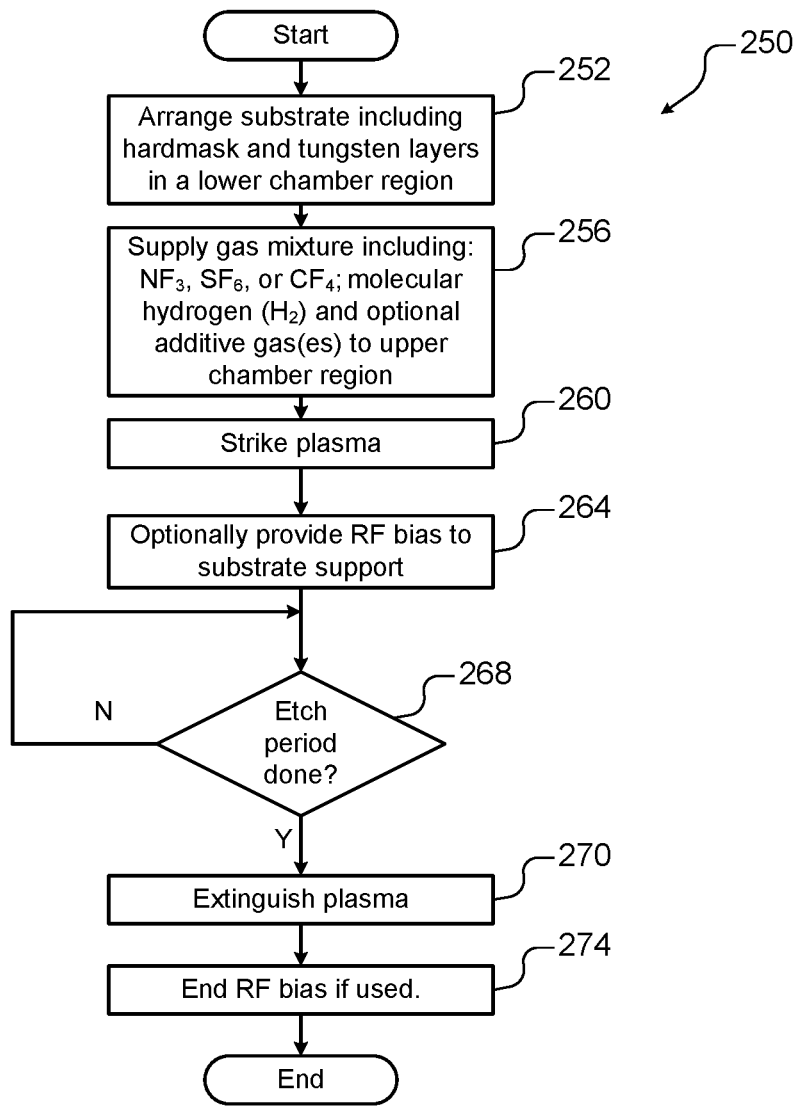
FIGS. 5-8 are flowcharts illustrating various examples of methods for selectively etching a W film layer according to the present disclosure.

Referring now to FIG. 5, a method 250 for etching W film using $NF_3$, $CF_4$ or $SF_6$ etch precursor and $H_2$ is shown. At 252, a substrate including a hard mask layer and a W layer is arranged on a substrate support in a lower chamber region. At 256, an etch gas mixture includes an etch precursor selected from a group consisting of carbon tetrafluoride ($CF_4$), sulfur hexafluoride ($SF_6$), or nitrogen trifluoride ($NF_3$). The etch gas further includes molecular hydrogen ($H_2$) and one or more optional additive gas(es). Plasma is struck in the upper chamber region at 260. At 264, an RF bias is optionally supplied to the substrate support. At 268, the method determines whether a predetermined etch period has ended. At 270, the plasma is extinguished when the predetermined etch period ends. At 274, the RF bias is terminated if used.

In some examples, excess fluorine produced from dissociation of fluorine etch gas is scavenged by the hydrogen in the confined plasma. This produces enough fluorine to etch the W layer on the substrate 126 but not enough to attack the hard mask layer in absence of substantial ion flux. Since ion density is very low in the lower chamber region 102 below the gas distribution device 114 when the RF bias is low or not used, ion-assisted SiN etching is not supported on the substrate 126.

For example only, a W etch rate of 50 Angstroms/min was achieved with over 1000:1 selectivity to SiN at 5000 sccm of $H_2$ and 5% $CF_4$ at 40° C., although other temperatures and flow rates can be used. Variations in flow, pressure, and substrate temperature can be performed to increase W etch rate while balancing SiN selectivity.

With $SF_6$ addition, sulfur-based deposition may occur at lower substrate temperatures (~40° C.); this condition did not etch W. W etching was achieved at 100° C. substrate temperature with $SF_6$ based processes, although other temperatures can be used. Low temperature sulfur passivation may be used as a sidewall protecting mechanism. In some examples, this approach may be used to recess W in ONON/OPOP stack post CVD W deposition in slit features. In some examples, additive gases like Ar, He, or $N_2$ can be added to this process to achieve desired results.

In some examples, the RF power supplied to the inductive coil is in a range from 1000 to 3000 W at a frequency of 13.56 MHz, although other frequencies and power levels may be used. If used, the RF bias may be supplied to the substrate support in a range from 100 to 1000 W at a frequency of 13.56 MHz, although other frequencies and power levels may be used. In some examples, the substrate support is maintained at a temperature in a range from 40° C. to 120° C., although other temperatures can be used. Example flow rates for the gases are shown in the Table below:

| Gas | Flow Rate (sccm) |
| --- | --- |
| $SF_6$ | 10-500 |
| $NF_3$ | 10-500 |
| $CF_4$ | 10-500 |
| $H_2$ | 500-5000 |

Selective Etching of W Film Using CO and $N_2$

Figure 6:
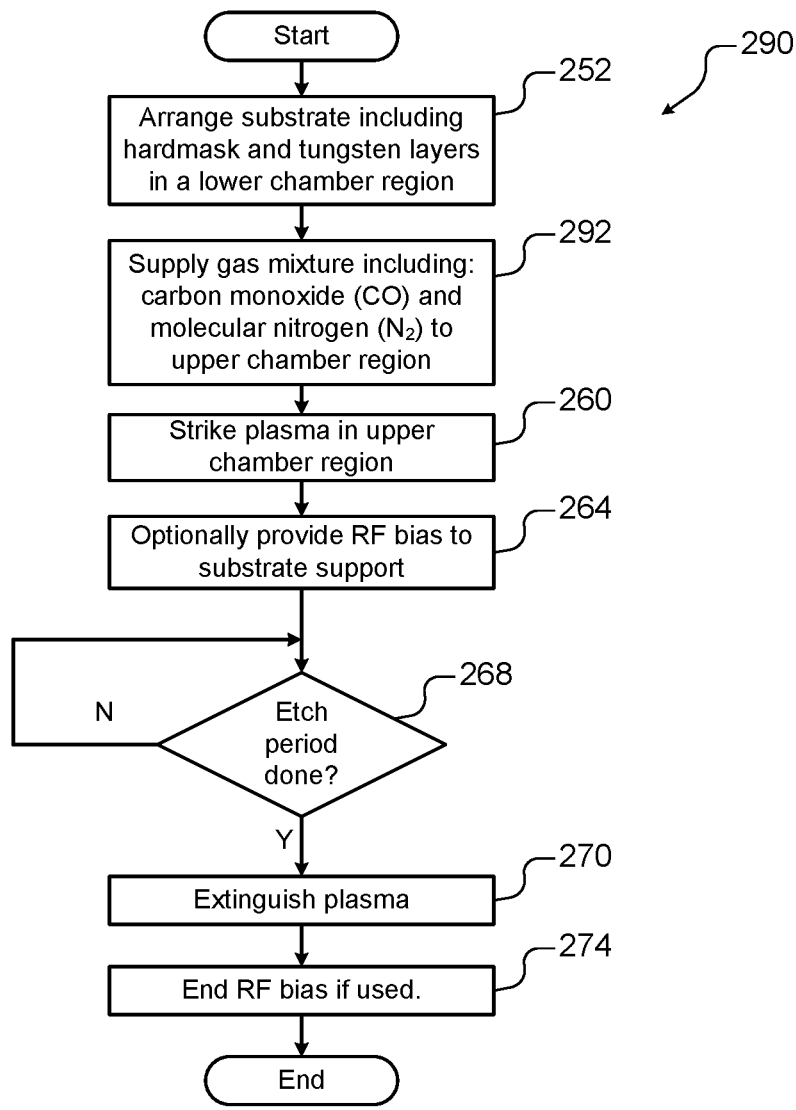

Referring now to FIG. 6, the W layer can also be selectively etched through a carbonyl formation route since $W(CO)_6$ is a volatile precursor. In some examples, the processing chamber described above in FIG. 4 is used. A method 290 includes the step of supplying a gas mixture including carbon monoxide (CO), molecular nitrogen ($N_2$) and optional additive gas(es) at 292. The CO gas is excited in the high pressure plasma region in the upper chamber region. $N_2$ has lot of rovibrational excited states that can be utilized to excite CO. In some examples of this process, the CO is excited but not dissociated so that it can react with W to form volatile carbonyl compounds.

In some examples, the CO gas is introduced using side injection for example at 136 to avoid dissociation in the hot plasma zone. By introducing CO using side injection, the CO is excited but not dissociated.

In some examples, the RF power supplied to the inductive coil is in a range from 1000 to 3000 W at a frequency of 13.56 MHz, although other frequencies and power levels may be used. If used, the RF bias may be supplied to the substrate support in a range from 100 to 1000 W at a frequency of 13.56 MHz, although other frequencies and power levels may be used. In some examples, the substrate support is maintained at a temperature in a range from 40° C. to 120° C., although other temperatures can be used. In some examples, the plasma reactor operates in a pressure range from 0.4 Torr to 10 Torr, although other pressures can be used. In some examples, the plasma reactor operates in a pressure range from 0.5 Torr to 6 Torr, although other pressures may be used. Example flow rates for the gases are shown in the Table below:

| Gas | Flow Rate (sccm) |
|---|---|
| CO | 10-500 |
| $N_2$ | 500-5000 |

Selective Etching of W Film Using $SF_6$, $NF_3$, $CH_3F$, $CH_2F_2$ or $CF_4$ and $N_2$ and/or $O_2$ Selective etching of W film can be performed using a fluorine-based etch gas (such as $SF_6$, $NF_3$, fluoromethane ($CH_3F$), difluoromethane ($CH_2F_2$) or CEO and $N_2$ and/or $O_2$ with very high selectivity to other film materials. In some examples, etching of the W film and the barrier layer is performed with an etch ratio of 0.9:1 to 1.1:1, although other etch ratios can be used. In some examples, etching of the W film and the barrier layer is performed with an etch ratio of 1:1. In some examples, the method is performed in the substrate processing system shown and described above in FIG. 4. In some examples, molecular chlorine ($Cl_2$) may optionally be added to the etch gas mixture. In some examples, the supply of $CH_3F$ or $CH_2F_2$ to the gas mixture increases polymer passivation within structure shown in FIGS. 3A and 3B. In the high pressure regime, more polymer deposition on top of structure and can control the top/bottom recess ratio of layer 54.

In some examples, the RF power supplied to the inductive coil is in a range from 1000 to 3000 W at a frequency of 13.56 MHz, although other frequencies and power levels may be used. If used, the RF bias may be supplied to the substrate support in a range from 100 to 1000 W at a frequency of 13.56 MHz, although other frequencies and power levels may be used. In some examples, the substrate support is maintained at a temperature in a range from 40° C. to 120° C., although other temperatures can be used. In some examples, the plasma reactor operates in a pressure range from 0.4 Torr to 10 Torr, although other pressures can be used. Example flow rates for the gases are shown in the Table below:

| Gas | Flow Rate (sccm) |
|---|---|
| $SF_6$ | 10-500 |
| $NF_3$ | 10-500 |
| $CF_4$ | 10-500 |
| $O_2$ | 500-5000 |
| $N_2$ | 500-5000 |
| $Cl_2$ | 50-150 |
| $CH_2F_2$ | 10-500 |
| $CH_3F$ | 10-500 |

Figure 7:
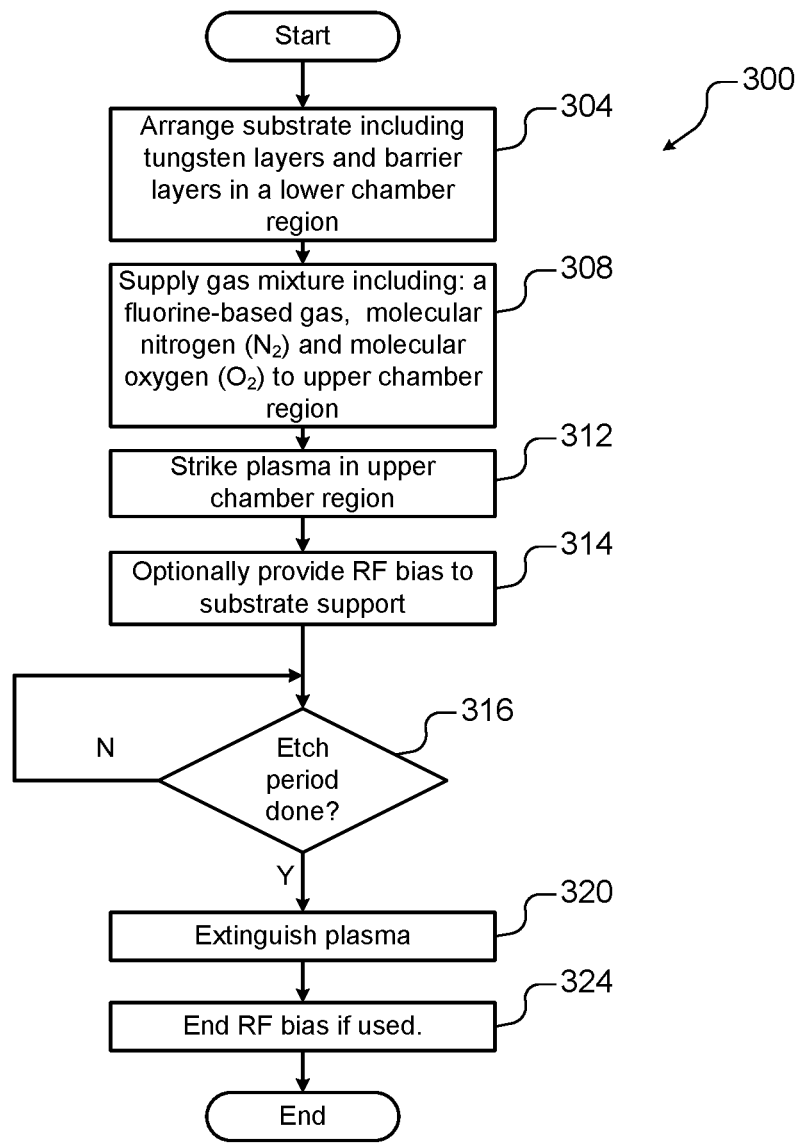

Referring now to FIG. 7, a method 300 for selectively etching W film is shown. At 304, a substrate is arranged in a lower chamber region of the substrate processing system. The substrate includes one or more W layers and a barrier layer. At 308, a gas mixture including a fluorine-based gas (such as $SF_6$, $NF_3$, $CF_4$, $CH_2F_2$, or $CH_3F$) and both $N_2$ and $O_2$ is supplied to the upper chamber region. At 312, plasma is struck in the upper chamber region. At 314, an RF bias is optionally supplied to the substrate support. At 316, the method determines whether the etch period is over. When the etch period is over, the plasma is extinguished at 320 and the RE bias is ended if used at 324.

Figure 8:
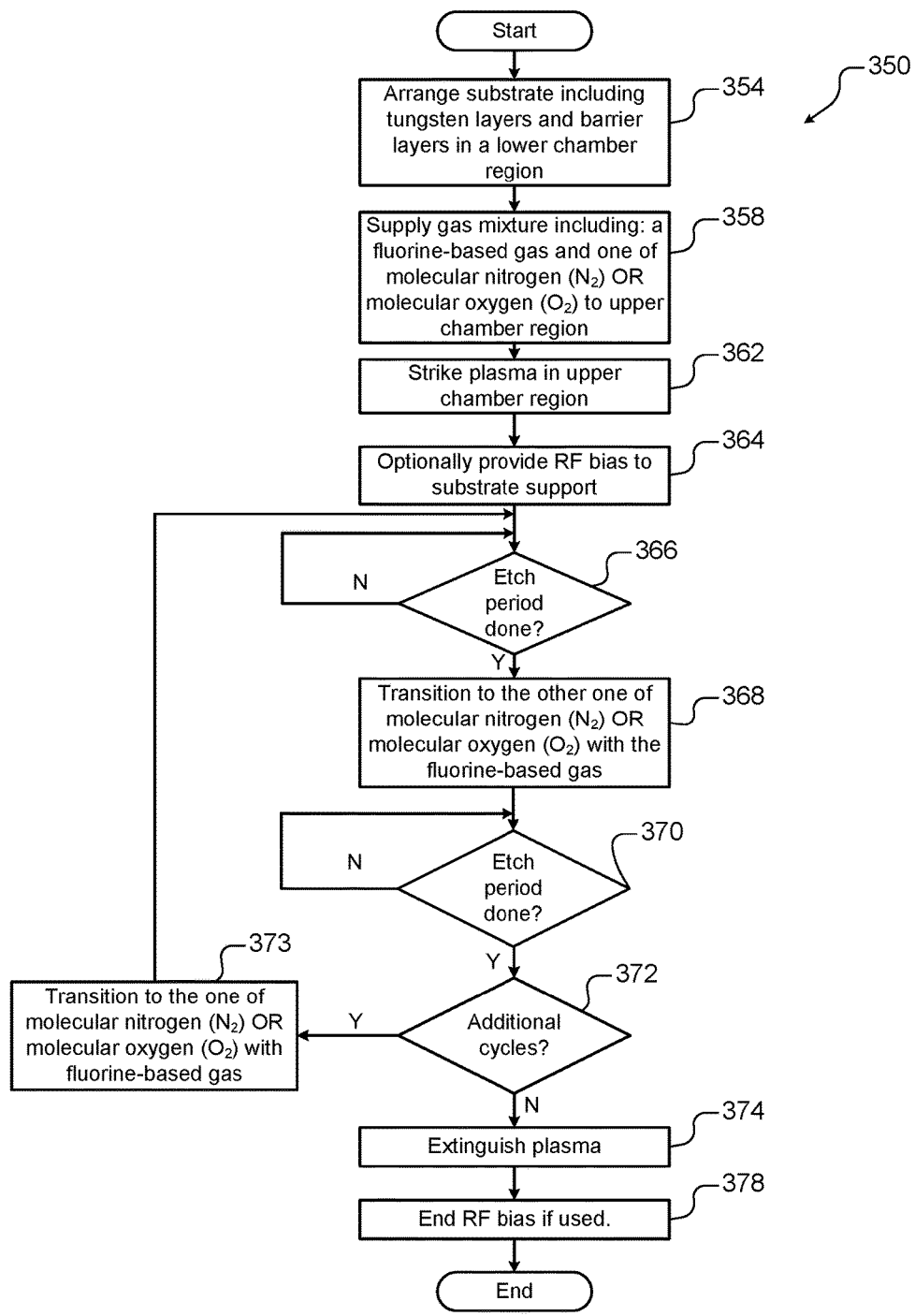

Referring now to FIG. 8, instead of supplying both $N_2$ and $O_2$ at the same time, a method 350 for etching uses a gas mixture including a fluorine-based gas with alternating use of $N_2$ or $O_2$ during contiguous periods. At 354, a substrate including a tungsten layer and a barrier layer is arranged in a lower chamber region. At 358, a gas mixture is supplied including a fluorine-based gas and $N_2$ (or $O_2$). At 362, plasma is struck in the upper chamber region. At 364, an RF bias is optionally supplied to the substrate support.

Etching is performed for a predetermined period as determined at 366. At 368, the gas mixture is transitioned to using the fluorine-based gas and $O_2$ (or $N_2$). As can be appreciated, the order of $N_2$ and $O_2$ can be varied. Etching is performed for a predetermined period as determined at 370. In some examples, the predetermined periods at 366 and 370 may be the same or different. In some examples, the predetermined period at 366 and 370 are in a range from 5 to 60 seconds, although different periods may be used. The process can be repeated for one or more additional cycles. When the additional cycles are complete as determined at 372, the plasma is extinguished at 374 and the RF bias is ended if used at 378.

Figure 9:
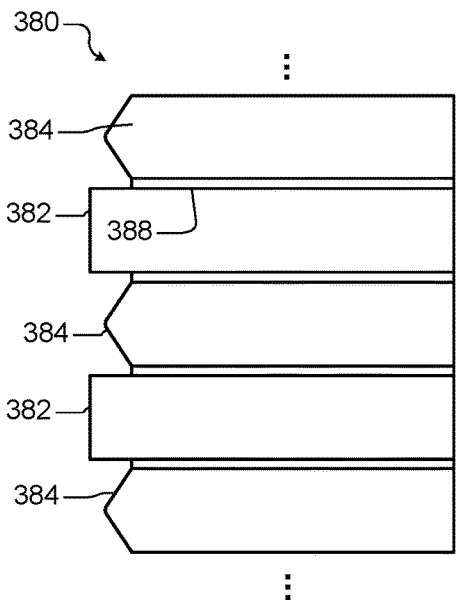
FIG. 9-11 are cross-sectional side views of an example of a substrate including a W film layer before and after etching according to the present disclosure.
Figure 10:
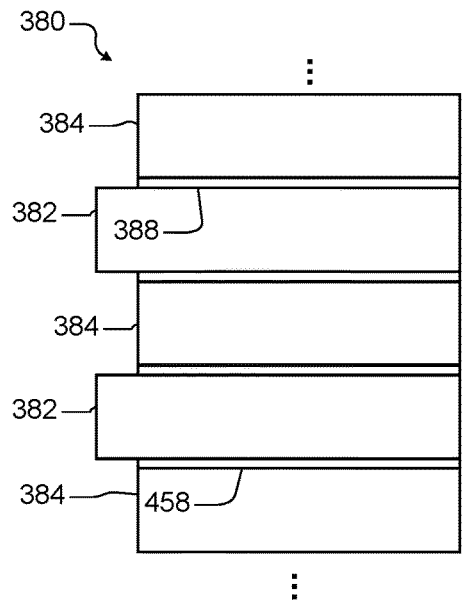
Figure 11:
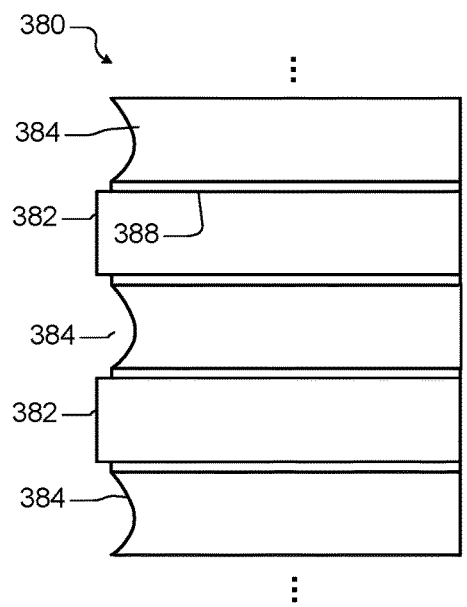

Referring now to FIGS. 9-11, a stack 380 including alternating fin layers 382 and W film layers 384 are shown. In some examples, a barrier layer 388 is arranged on the fin layers 382. In FIG. 9, the stack 380 is shown after etching using the fluorine-based gas and $O_2$. As can be seen, an etch front on the W film layers 384 is convex. In FIG. 10, the stack 380 is shown after etching using the fluorine-based gas and $N_2$. As can be seen, the etch front on the W film layers 384 is now flat. Alternately, etching using the fluorine-based gas and $N_2$ can be performed to create a concave etch front on the W film layers 384 as shown in FIG. 11. Then, etching can be performed using the fluorine-based gas and $O_2$ to create a flat etch front.

Selective Etching of W Film Using $Cl_2$ and $O_2$

Selective etching of W film can be performed using $Cl_2$ and $O_2$ with very high selectivity to other film materials. In some examples, etching of the W film and the barrier layer is performed with an etch ratio of 0.9:1 to 1.1:1, although other etch ratios can be used. In some examples, etching of the W film and the barrier layer is performed with an etch ratio of 1:1. In some examples, the method is performed in the substrate processing system shown and described above in FIG. 4.

Figure 12:
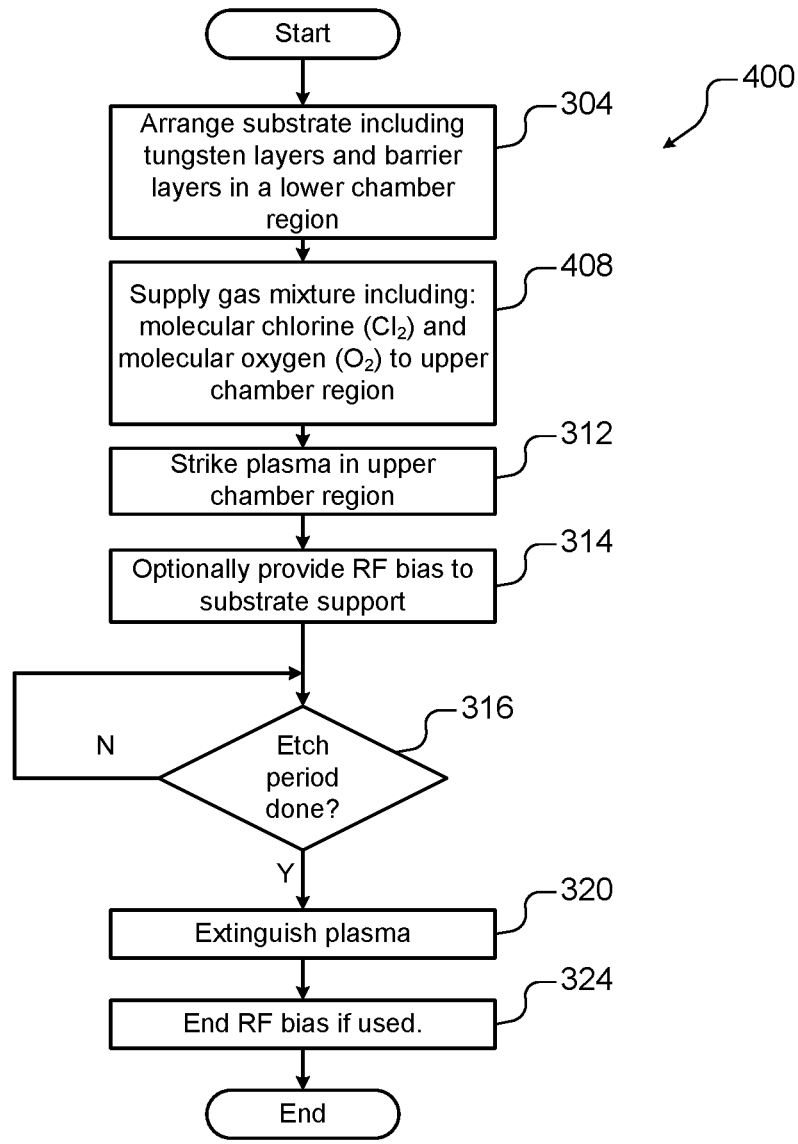
FIG. 12-13 are flowcharts illustrating various examples of methods for selectively etching a W film layer according to the present disclosure.

Referring now to FIG. 12, a method 400 for selectively etching W film is shown. At 304, a substrate is arranged in a lower chamber region of the substrate processing system. The substrate includes one or more tungsten layers and a barrier layer. At 408, a gas mixture including $Cl_2$ and $O_2$ is supplied to the upper chamber region. At 312, plasma is struck in the upper chamber region. At 314, an RF bias is optionally supplied to the substrate support. At 316, the method determines whether a predetermined etching period has ended. When the predetermined etching period is over, the plasma is extinguished at 320 and the RF bias is ended if used at 324.

In some examples, the RF power supplied to the inductive coil is in a range from 1000 to 3000 W at a frequency of 13.56 MHz, although other frequencies and power levels may be used. If used, the RF bias may be supplied to the substrate support in a range from 100 to 1000 W at a frequency of 13.56 MHz, although other frequencies and power levels may be used. In some examples, the substrate support is maintained at a temperature in a range from 40° C. to 120° C., although other temperatures can be used. In some examples, the plasma reactor operates in a pressure range from 0.4 Torr to 10 Torr, although other pressures can be used. Example flow rates for the gases are shown in the Table below:

| Gas | Flow Rate (sccm) |
| --- | --- |
| $Cl_2$ | 10-500 |
| $O_2$ | 500-5000 |

Selective Etching of W Film Using $SF_6$, $NF_3$, $CH_3F$, $CH_2F_2$ or $CF_4$ and $Cl_2$ Selective etching of W film can be performed using a fluorine-based gas (such as $SF_6$, $NF_3$, $CH_3F$, $CH_2F_2$ or $CF_4$) and molecular chlorine ($Cl_2$) with very high selectivity to other film materials. In some examples, etching of the W film and the barrier layer is performed with an etch ratio of 0.9:1 to 1.1:1, although other etch ratios can be used. In some examples, etching of the W film and the barrier layer is performed with an etch ratio of 1:1.

Figure 13:
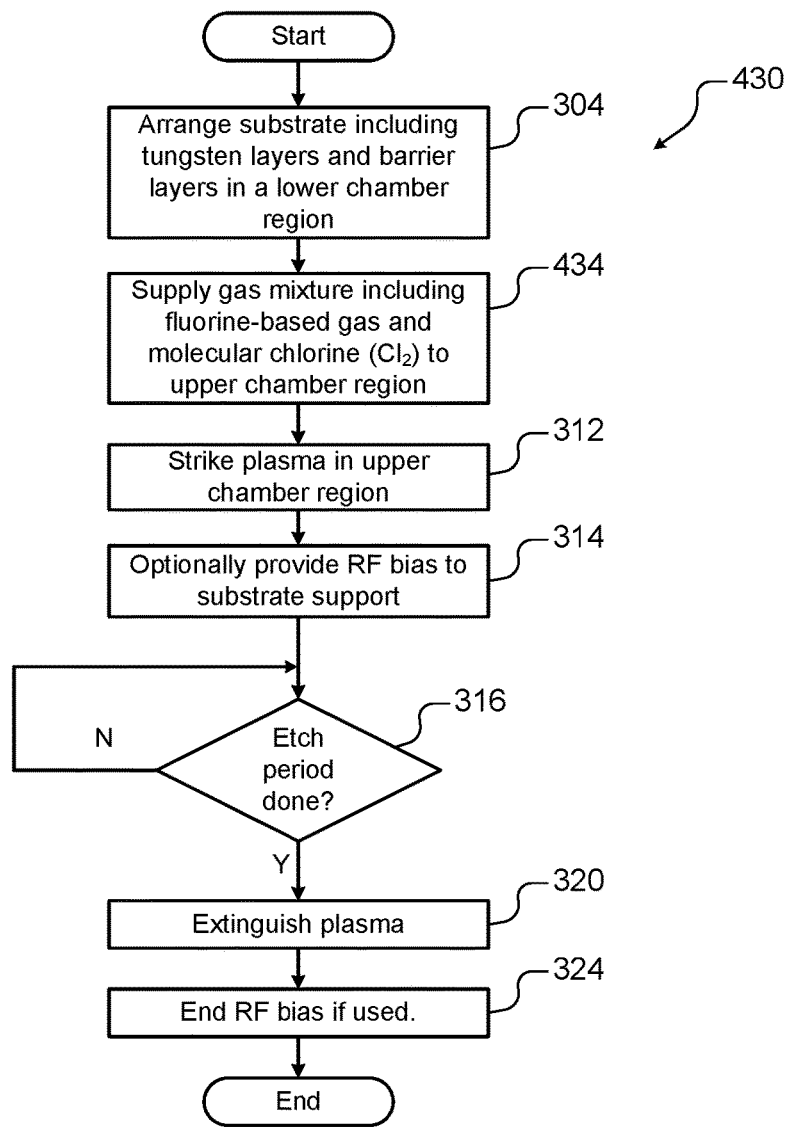

Referring now to FIG. 13, a method 430 for selectively etching W film is shown. At 304, a substrate is arranged in a lower chamber region of the substrate processing system. The substrate includes one or more tungsten layers and a barrier layer. At 434, a gas mixture including a fluorine-based gas and molecular chlorine ($Cl_2$) is supplied to the upper chamber region. At 312, plasma is struck in the upper chamber region. At 314, an RF bias is optionally supplied to the substrate support. At 316, the method determines whether the etch period is over. When the etch period is over, the plasma is extinguished at 320 and the RF bias is ended if used at 324.

In some examples, the RF power supplied to the inductive coil is in a range from 1000 to 3000 W at a frequency of 13.56 MHz, although other frequencies and power levels may be used. If used, the RF bias may be supplied to the substrate support in a range from 100 to 1000 W at a frequency of 13.56 MHz, although other frequencies and power levels may be used. In some examples, the substrate support is maintained at a temperature in a range from 40° C. to 120° C., although other temperatures can be used. In some examples, the plasma reactor operates in a pressure range from 0.4 Torr to 10 Torr, although other pressures can be used. Example flow rates for the gases are shown in the Table below:

| Gas | Flow Rate (sccm) |
| --- | --- |
| $SF_6$ | 10-500 |
| $NF_3$ | 10-500 |
| $CF_4$ | 10-500 |
| $CH_2F_2$ | 10-500 |
| $CH_3F$ | 10-500 |
| $Cl_2$ | 10-150 |
| Ar | 100-5000 |

The present disclosure allows selective etching of tungsten relative to other films such as silicon nitride, silicon dioxide, metal oxide, carbon and other film materials. In some examples, the systems and methods described herein can remove a barrier layer made of film materials such as titanium (Ti) or titanium nitride (TiN) at a 0.9:1 to 1.1:1, although other etch ratios can be used ratio (e.g. 1:1) relative to etching of tungsten film and greater than or equal to 100:1 selectivity relative to metal oxides. In other examples, etch selectivity of W film relative to certain film materials such as SiN and $SiO_2$ film is greater than 100:1 or even 1000:1.

In some examples, the present disclosure can create etch front profiles having concave, convex or flat modes. In some examples, the present disclosure passivates small voids within tungsten films to prevent random etch depth variations. In some examples, the present disclosure can ignite capacitive coupling of plasma within downstream plasma to generate ions to control top to bottom etch ratios for high aspect ratio structures and crossbar memory devices.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method comprising:
    arranging a substrate including a plurality of stacks of layers arranged adjacent to each other on a substrate support of a substrate processing chamber, a distance separating the plurality of stacks being less than a height of the plurality of stacks, and each of the plurality of stacks including N sets of layers, each of the N sets including layers in the following order, N being an integer greater than 1:
        an oxide layer,
        a first barrier layer,
        a tungsten layer, and
        a second barrier layer,
    wherein the substrate processing chamber includes an upper chamber region, an inductive coil arranged outside of the upper chamber region, a lower chamber region including the substrate support and a gas dispersion device arranged between the upper chamber region and the lower chamber region, and
    wherein the gas dispersion device includes a plurality of holes in fluid communication with the upper chamber region and the lower chamber region;
    controlling pressure in the substrate processing chamber in a range from 0.4 Torr to 10 Torr;
    supplying an etch gas mixture including fluorine-based gas to the upper chamber region;
    striking inductively coupled plasma in the upper chamber region by supplying power to the inductive coil; and
    selectively etching, in each of the plurality of stacks, the tungsten layers and the first and second barrier layers inwardly relative to the oxide layers while preventing etching of voids in the tungsten layers if the tungsten layers include voids.

2. The method of claim 1, wherein the oxide layers include silicon nitride, silicon dioxide, metal oxide or carbon.

3. The method of claim 1, wherein the etch gas mixture includes molecular hydrogen and a gas selected from a group consisting of carbon tetrafluoride, nitrogen trifluoride, and sulfur hexafluoride.

4. The method of claim 3, wherein the each of the plurality of stacks includes a hard mask layer and wherein the tungsten layers are selectively etched relative to the hard mask layers.

5. The method of claim 4, wherein the hard mask layers are made of a material selected from a group consisting of silicon nitride, silicon dioxide and carbon.

6. The method of claim 3, wherein the selective etching of the tungsten layers is greater than 100:1.

7. The method of claim 1, wherein the etch gas mixture includes a first gas selected from a group consisting of molecular chlorine, molecular oxygen and molecular nitrogen and a second gas selected from a group consisting of carbon tetrafluoride, nitrogen trifluoride, sulfur hexafluoride, fluoromethane and difluoromethane.

8. The method of claim 7, wherein the selective etching of the tungsten layers is greater than 100:1, and etching of the tungsten layers relative to the first and second barrier layers is between 0.9:1 and 1.1:1.

9. The method of claim 7, wherein the first gas includes both molecular oxygen and molecular nitrogen.

10. The method of claim 7, further comprising:
supplying the first gas including one of molecular oxygen and molecular nitrogen with the second gas during a first predetermined etch period; and
after the first predetermined etch period, supplying the first gas including the other one of molecular oxygen and molecular nitrogen with the second gas during a second predetermined etch period.

11. The method of claim 10, wherein the first predetermined period and the second predetermined period are in a range from five seconds to 60 seconds.

12. The method of claim 11, wherein the plurality of holes have diameters in a range from 0.4" to 0.75".

13. The method of claim 1, wherein a radio frequency (RF) bias is supplied to the substrate support.

14. The method of claim 1, wherein a radio frequency (RF) bias is not supplied to the substrate support.

15. The method of claim 1, wherein the etch gas mixture includes one or more additive gases selected from a group consisting of argon, helium, and molecular nitrogen.

16. The method of claim 1, wherein the gas dispersion device includes a showerhead plate including a plurality of holes.

17. The method of claim 1, wherein a gas injector is arranged adjacent to an upper surface of the upper chamber region to inject the etch gas mixture, the gas dispersion device is arranged adjacent to a lower surface of the upper chamber region, and the gas dispersion device is connected to a reference potential.

18. The method of claim 1, wherein the etch gas mixture further comprises molecular chlorine.

19. The method of claim 1, wherein the first and second barrier layers are made of titanium or titanium nitride.

20. A method comprising:
arranging a substrate including a plurality of stacks of layers arranged adjacent to each other on a substrate support of a substrate processing chamber, a distance separating the plurality of stacks being less than a height of the plurality of stacks, and each of the plurality of stacks including N sets of layers, each of the N sets including layers in the following order, N being an integer greater than 1:
an oxide layer,
a first barrier layer,
a tungsten layer, and
a second barrier layer,
wherein the substrate processing chamber includes an upper chamber region, an inductive coil arranged outside of the upper chamber region, a lower chamber region including the substrate support and a gas dispersion device arranged between the upper chamber region and the lower chamber region, and
wherein the gas dispersion device includes a plurality of holes in fluid communication with the upper chamber region and the lower chamber region;
controlling pressure in the substrate processing chamber in a range from 0.4 Torr to 10 Torr;
supplying an etch gas mixture to the upper chamber region, wherein the etch gas mixture includes carbon monoxide;
striking inductively coupled plasma in the upper chamber region by supplying power to the inductive coil; and
selectively etching, in each of the plurality of stacks, the tungsten layers and the first and second barrier layers inwardly relative to the oxide layers while preventing etching of voids in the tungsten layers if the tungsten layers include voids.

* * * * *